(12) United States Patent
Maisonneuve (10) Patent No.: US 9,196,090 B2
(45) Date of Patent: Nov. 24, 2015

(54) DESIGNING A 3D MODELED OBJECT

(71) Applicant: Dassault Systemes, Velizy Villacoublay (FR)

(72) Inventor: Richard Maisonneuve, Aix en Provence (FR)

(73) Assignee: Dassault Systemes, Velizy Villacoublay (FR)

( * ) Notice: Subject to any disclaimer, the term of this patent is extended or adjusted under 35 U.S.C. 154(b) by 331 days.

(21) Appl. No.: 13/872,442

(22) Filed: Apr. 29, 2013

(65) Prior Publication Data
US 2013/0293541 A1 Nov. 7, 2013

(30) Foreign Application Priority Data

May 2, 2012 (EP) .................................. 12305490

(51) Int. Cl.
*G06T 15/30* (2011.01)
*G06T 17/20* (2006.01)
*G06F 17/50* (2006.01)

(52) U.S. Cl.
CPC .......... *G06T 17/205* (2013.01); *G06F 17/5086* (2013.01)

(58) Field of Classification Search
None
See application file for complete search history.

(56) References Cited

U.S. PATENT DOCUMENTS

| | | | |
|---|---|---|---|
| 4,797,842 A | 1/1989 | Nackman et al. | |
| 6,037,949 A | 3/2000 | DeRose et al. | |
| 6,271,856 B1 * | 8/2001 | Krishnamurthy | 345/581 |
| 6,553,337 B1 | 4/2003 | Lounsbery | |
| 6,587,105 B1 | 7/2003 | Stam | |
| 6,603,473 B1 | 8/2003 | Litke et al. | |
| 6,636,853 B1 | 10/2003 | Stephens | |
| 6,639,592 B1 | 10/2003 | Dayanand et al. | |
| 6,760,022 B1 | 7/2004 | Anderson | |

(Continued)

FOREIGN PATENT DOCUMENTS

| | | |
|---|---|---|
| EP | 1750229 | 2/2007 |
| EP | 1881457 | 1/2008 |

(Continued)

OTHER PUBLICATIONS

European Search Report of Application No. EP 12 30 5490 dated Feb. 21, 2013.
Hermann, T. et al., "Geometrical Criteria on the Higher Order Smoothness of Composite Surfaces", Computer Aided Geometric Design, vol. 16, No. 9, pp. 907-911, Oct. 1999.
DeRose T., et al., "Subdivision Surfaces in Character Animation", Computer Graphics SIGGRAPH 98 Conference Proceedings, pp. 85-94; Jan. 1, 1998.

(Continued)

*Primary Examiner* — Ryan R Yang
*Assistant Examiner* — Anh-Tuan V Nguyen
(74) *Attorney, Agent, or Firm* — Hamilton, Brook, Smith & Reynolds, P.C.

(57) ABSTRACT

It is provided a computer-implemented method for designing a 3D modeled object. The method comprises providing a base mesh controlling a subdivision surface. The subdivision surface models the 3D modeled object. The method also comprises providing a polyline consisting of connected edges of the base mesh and defining a smooth portion of the polyline comprising an extremity of the polyline and a sharp portion of the polyline upstream the smooth portion. The method also comprises converting faces of the mesh adjacent to the polyline into parametric patches approximating the subdivision surface. The patches have a G0 connection across the sharp portion of the polyline, and the patches have a Gi connection across the smooth portion of the polyline, where i is an integer higher or equal to 1.
Such a method improves the design of a 3D modeled object modeled by a subdivision surface.

15 Claims, 9 Drawing Sheets

(56) References Cited

U.S. PATENT DOCUMENTS

| | | | |
|---|---|---|---|
| 6,806,874 | B2 | 10/2004 | Biermann et al. |
| 6,920,419 | B2 | 7/2005 | Kitamura et al. |
| 6,950,099 | B2 | 9/2005 | Stollnitz et al. |
| 7,023,435 | B1 | 4/2006 | Litke et al. |
| 7,170,516 | B2 | 1/2007 | Stollnitz et al. |
| 7,200,532 | B1 | 4/2007 | Cheng |
| 7,251,777 | B1 | 7/2007 | Valtchev et al. |
| 7,369,972 | B2 | 5/2008 | Boier-Martin et al. |
| 7,400,323 | B2 | 7/2008 | Nigro |
| 7,417,635 | B2 | 8/2008 | Rockwood et al. |
| 7,423,641 | B2 | 9/2008 | Borac |
| 7,595,799 | B2 | 9/2009 | Nigro |
| 7,636,091 | B2 | 12/2009 | Rockwood et al. |
| 7,893,937 | B2 | 2/2011 | Rosel et al. |
| 7,952,575 | B2 | 5/2011 | Rosel |
| 8,269,770 | B1 | 9/2012 | Carr et al. |
| 8,471,852 | B1* | 6/2013 | Bunnell ............... 345/423 |
| 2002/0152222 | A1 | 10/2002 | Holbrook |
| 2003/0020710 | A1 | 1/2003 | Biermann et al. |
| 2003/0218609 | A1* | 11/2003 | Maillot et al. ........ 345/423 |
| 2004/0085311 | A1 | 5/2004 | Lee et al. |
| 2004/0189633 | A1 | 9/2004 | Sederberg |
| 2007/0030267 | A1 | 2/2007 | Nigro |
| 2007/0030268 | A1 | 2/2007 | Nigro |
| 2007/0176923 | A1* | 8/2007 | Lee et al. ............. 345/420 |
| 2008/0024499 | A1* | 1/2008 | Bateman ............... 345/441 |
| 2008/0036755 | A1* | 2/2008 | Bae et al. ............. 345/418 |
| 2008/0225043 | A1* | 9/2008 | Rosel .................. 345/420 |
| 2008/0246767 | A1 | 10/2008 | Shen et al. |
| 2009/0027396 | A1* | 1/2009 | Frisken ............... 345/442 |
| 2009/0102833 | A1 | 4/2009 | Boier-Martin et al. |
| 2009/0128556 | A1 | 5/2009 | Fischer et al. |
| 2009/0201295 | A1* | 8/2009 | Kripac et al. ......... 345/442 |
| 2012/0206457 | A1* | 8/2012 | Crocker ............... 345/420 |
| 2013/0120383 | A1* | 5/2013 | Joshi et al. ........... 345/423 |
| 2013/0124149 | A1* | 5/2013 | Carr et al. ............ 703/1 |
| 2013/0271459 | A1* | 10/2013 | Gary .................. 345/420 |

FOREIGN PATENT DOCUMENTS

| | | |
|---|---|---|
| EP | 1881458 | 1/2008 |
| EP | 1883020 | 1/2008 |
| JP | 2001-067491 | 3/2001 |
| WO | WO 01/08102 | 2/2001 |
| WO | WO 03/098477 | 11/2003 |
| WO | WO 2004/088468 | 10/2004 |
| WO | WO 2006/017723 | 2/2006 |

OTHER PUBLICATIONS

Hughes, H., et al. "Piecewise Smooth Surface Reconstruction" SIGGRAPH 94 Conference Proceedings, pp. 295-302; Jul. 24, 1998.
Pernot, J-P, et al. "A Shapte Deformation Tool to Model Character Lines in Early Design Phases" Proceedings SMI, Shapte Modeling International, IEEE Computer Soc., pp. 165-276; 2002.
Zorin D. et al.: "Interpolating Subdivision for Meshes with Arbitrary Topology", Computer Graphics Proceedings 1996 (Siggraph), New Orleans, Aug. 4-9, 1996; Graphics Proceedings (Siggraph), New York, NY ACM, US, Aug. 4, 1996, pp. 189-192, XP000682735.
Mandal C. et al.: "A Novel Fem-based Dynamic Framework for Subdivision Surfaces", Computer Aided Design, Elsevier Publishers Bv., Barking, GB, vol. 32, No. 8-9, Aug. 1, 2000 (2000-OS-01), pp. 479-497, XP004203522 ISSN: 0010-4485.
Loop C.: "Second Order Smoothness Over Extraordinary Vertices", Eurographics Symposium on Geometry Processing, Eurographics Association, U.S., vol. 71, Jan. 1, 2004, pp. 165-174, XP007901487.
Prautzsch H. et al.: "A Ge1> and A Gc2> Subdivision Scheme for Triangular Nets", International Journal of Shape Modeling, World Scientific, Singapore, 5G, vol. 6, No. 1, Jun. 1, 2000, pp. 21-35, XP007910137 ISSN: 0218-6543.
Peters J.: "Cc2> Free-form Surfaces of Degree (3,5)", Computer Aided Geometric Design, North-Holland, vol. 19, No. 2, Feb. 1, 2002, pp. 113-126, XP007910102 ISSN: 0167-8396.
Prautzsch H.: Smoothness of Subdivision surfaces at extraordinary points, Advances in Computational Mathematics 9 (1998).
Ying L., Zorin D., "Nonmanifold subdivision", Proceedings of the Conference Visualization '01, San Diego, California, 2001, pp. 325331, 359, ISBN~ISSN :10702385, 078037000X.
Zorin D., "Classical subdivision surfaces II", Lecture No. 15 of course CS448 Topics in Computer Graphics Mathematical Methods for Computer Graphics, Dec. 1997, Stanford University (retrieved at http://graphics.stanford.edu/courses/cs44897fall/notes/lect15.ps).
Cotrina-Navau J. et al.: "A generic approach to free form surface generation".
Havemann et al.: "A versatile 3D Model Representation for Cultural Reconstruction".
Havemann et al.: "Progressive Combined BReps-Multi-Resolution Meshes for Incremental Real-Time Shape Manipulation".
Bolz et al.: "Rapid Evaluation of Catmull-Clark Subdivision Surfaces".
Boier-Martin et al.: "Differentiable Parameterization of Catmull-Clark Subdivision Surfaces".
Bézier, P.: "Courbes et surfaces", Paris, Hermès (1987).
P. de Casteljau Courbes et surfaces á pôles. Technical report, A. Citroen, Paris, 1963. See http://www.alatown.com/spline/ for a description of the reference.
Farin, G.: "Curves and surfaces for computer aided geometric design: a practical guide", San Diego, USA, Academic Press Professional, Inc. (1993).
Piegl, L.L., Tiller W.: "The NURBS Book", Springer, 1996.
Catmull E. and Clark J.: "Recursively generated B-spline surfaces on arbitrary topological meshes", Computer-Aided Design, 10:350-355, Jul. 1978.
J. Stam: "Exact Evaluation of Catmull-Clark Subdivision Surfaces At Arbitrary Parameter Values", Proceedings of SIGGRAPH 1998, pp. 395-404, Jul. 1998.
Jordan Smith and Carlo Sequin: "Eigen Structure of Stationary Subdivision Schemes and Differential Geometry of Surfaces".
Jörg Peters: "Patching Catmull-Clark Meshes", University of Florida.
Jörg Peters: "Modifications of PCCM", University of Florida.
Henning Biermanny, Ioana Martin, Fausto Bernardini, and Denis Zorin: "Cut-and-Paste Editing of Multi-resolution Surfaces", Proceedings of ACM SIGGRAPH 2002, vol. 21 Issue 3, Jul. 2002, pp. 312-321.
Piegl L., Tiller W.: "The NURBS Book", Springer, 2nd edition, 2013.
Won-Seek Lee, In-Ho Song and Sung-Chong Chung: "3D Reconstruction for the 3D engraving system from 2D images", ASPE Proceedings, Oct. 19-Oct. 24, 2008, Portland, Oregon.
Rick Leung, Stephen Mann : "Distortion Minimization and Continuity Preservation in Surface Pasting", Graphics Interface, p. 193-200, 2003.
Steven W. Smith : "The Scientist and Engineer's Guide to Digital Signal Processing".
D. Terzopoulos, H. Qin: "Dynamic NURBS with Geometric Constraints for Interactive Sculpting", ACM Transactions on Graphics, 13(2), Apr. 1994, 103-136.
S.M. Hu, Y.F. Li, T. Ju, X. Zhu : "Modifying the shape of NURBS surfaces with geometric constraints", Computer Aided Design, 33 (2001) 903-912.
Weiyin Ma, Nailiang Zhao: "Smooth multiple B-spline surface fitting with Catmull-Clark subdivision surfaces for extraordinary corner patches", The Visual Computer (2002), pp. 415-436.
Biermann H. et al.,: "Sharp Features on Multiresolution Subdivision Surfaces", Elsevier Science (2002), pp. 61-77.
Fussel, D. "Subdivision surfaces", University of Texas at Austin, 2010, retrieved from the Internet on Mar. 11, 2015.
Abi-Ezzi et al. (Fast Dynamic Tessellation of Trimmed NURBS Surfaced, vol. 13, 1994, Eurographics).

* cited by examiner

-- PRIOR ART --

-- PRIOR ART --

DESIGNING A 3D MODELED OBJECT

RELATED APPLICATION(S)

This application claims priority under 35 U.S.C. §119 or 365 to European, Application No. 12305490.0, filed May 2, 2012. The entire teachings of the above application(s) are incorporated herein by reference.

FIELD OF THE INVENTION

The invention relates to the field of computer programs and systems, and more specifically to a method, system and program for designing a 3D modeled object modeled by a subdivision surface.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such systems, the graphical user interface (GUI) plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Objects designed by the above systems are usually modeled by a 3D surface. Existing solutions for interactive design of surfaces include principally two technologies.

On the one hand, many solutions are based on the very popular non uniform rational B-spline surfaces (NURBS), such as the ones presented in the following papers:
Bézier, P. (1987). *Courbes et surfaces*. Paris, Hermès;
Casteljau, P. D. (1985). *Formes à Pôles*. Paris, Hermès;
Farin, G. (1993), *Curves and surfaces for computer aided geometric design: a practical guide*. San Diego, USA, Academic Press Professional, Inc; or
Piegl, L. L., Tiller W. (1996), *The NURBS book*. Springer.

Mainly, a NURBS surface is defined by a rectangular grid of control points together with other parameters to manage smoothness. Once the smoothness parameter is set, in order to change the shape of the surface, the user moves control points, which in turn changes the shape of the surface. In other words, the control points are the intermediate tool to edit the surface. The resulting surface is a rectangular patchwork of polynomial or rational patches. By nature, a patch surface features a rectangular topology, being bounded by four edges. This model is very popular because the relationship between control points and the resulting surface is very natural and intuitive. Furthermore, local influence of control points allows the user to design local details on the surface.

On the other hand, many solutions are based on subdivision surfaces such as the ones presented in the following papers:
E. Catmull and J. Clark, *Recursively generated B-spline surfaces on arbitrary topological meshes*. Computer-Aided Design, 10:350-355, July 1978;
J. Stam, *Exact Evaluation Of Catmull-Clark Subdivision Surfaces At Arbitrary Parameter Values*. Proceedings of SIGGRAPH 1998, pages 395-404, July 1998;
Jordan Smith and Carlo Sequin, *Eigen Structure of Stationary Subdivision Schemes and Differential Geometry of Surfaces;*
Jörg Peters, *Patching Catmull-Clark Meshes*, University of Florida; and
Jörg Peters, *Modifications of PCCM*, University of Florida.

A subdivision surface is defined by a polygonal mesh, named the "base mesh" in the following, which controls the shape of the surface. Nevertheless, is differs from the NURBS technology as explained in the following. Firstly, the topology of the base mesh is not restricted. It can be closed or open and can feature as many holes as needed. Secondly, the resulting subdivision surface from this base mesh is a theoretical surface that is the limit surface of an infinite and convergent subdivision process starting with the base mesh. Despite the actual subdivision surface is out of reach from the theoretical point of view, it can be approximated with a very good precision by a set of adjacent NURBS surface patches, as detailed in documents U.S. Pat. No. 7,595,799, U.S. Pat. No. 7,400,323 or EP1750229. Here again, local reshaping is allowed, but by refining the base mesh and by moving control points of the base mesh.

As opposed to mechanical or functional surfaces, styling surfaces are based on a detailed design (i.e. "styling design"), resulting in a surface with many and precise geometric features. One goal of styling design is to create a so-called "character line" on the surface. A character line is a sharp and long fold that runs on the surface. When this feature ends in the interior of the surface, a so-called "transition zone" is where the sharp fold gets smoother and smoother in order to vanish within the neighboring surface. Both NURBS and subdivision surfaces can design a character line by adjusting control points.

The subdivision surface technology is preferred for styling design because of its unrestricted topology (as opposed to the rectangular topology of a NURBS surface). A problem is that the resulting shape of the character line and its transition zone is not satisfactory when using a subdivision surface. Tests performed on industrial styling surfaces show that a skilled designer is not able to adjust the base mesh in order to get the expected character line and transition zone. Consequently, and using prior art technology, the existing solution is to (1) create the approximate NURBS surface approximating the subdivision surface, (2) remove manually from this NURBS surface the (unsatisfactory) transition zone, (3) design a local NURBS surface featuring the correct shape and (4) join this local surface to the surface from step (2).

Clearly, this methodology provides a correct result. The drawback is that if the initial subdivision surface is modified afterward, the transition zone must be created again on the modified surface. The designer is forced to run again steps (2) to (4) by hand, which is time consuming. This is because steps (2) to (4) are not captured through a history by the CAD system and thus cannot be replayed automatically when the input surface is changed.

Thus, the solutions listed above lack efficiency, notably from a user utilization point of view. Within this context, there is still a need for an improved solution for designing a 3D modeled object modeled by a subdivision surface.

SUMMARY OF THE INVENTION

According to one aspect, it is therefore provided a computer-implemented method for designing a 3D modeled object. The method comprises the step of providing a base mesh controlling a subdivision surface. The subdivision surface models the 3D modeled object. The method also comprises the steps of providing a polyline consisting of connected edges of the base mesh and defining a smooth portion of the polyline comprising an extremity of the polyline and a sharp portion of the polyline upstream the smooth portion. The method also comprises the step of converting faces of the mesh adjacent to the polyline into parametric patches approximating the subdivision surface. The patches have a G0 connection across the sharp portion of the polyline, and the patches have a Gi connection across the smooth portion of the polyline, where i is an integer higher or equal to 1.

The method may comprise one or more of the following:
defining the smooth portion comprises defining a smooth point on the polyline, the smooth portion being delimited by the smooth point and the extremity of the polyline;
the defining step comprises defining a sharp point on the polyline upstream the smooth point, the sharp portion being delimited by the sharp point and being upstream the sharp point;
the converting step comprises converting faces adjacent to edges of the polyline intersecting the smooth portion into first patches, in which said conversion applies a Gi connection attribute to said edges, and converting faces adjacent to edges of the polyline intersecting the sharp portion into second patches, in which said conversion applies a G0 connection attribute to said edges thus resulting in a sharp curve on the assembly of the second patches, said sharp curve corresponding to said edges; then trimming the second patches downstream the sharp point;
the converting step further comprises trimming the first patches upstream a point corresponding to the smooth point;
the method further comprises extrapolating the sharp curve, projecting the extrapolation of the sharp curve on the first patches, determining a connection curve by blending the projection of the extrapolation of the sharp curve with the sharp curve, then filling the two holes formed between the first patches, the second patches, the connection curve, and patches corresponding to faces of the mesh not adjacent to the polyline;
wherein determining the connection curve comprises user-interaction; and/or
the parametric patches are NURBS.

It is further proposed a computer program comprising instructions for performing the above method.

It is further proposed a computer readable storage medium having recorded thereon the above computer program.

It is further proposed a CAD system comprising a processor coupled to a memory and a graphical user interface, the memory having recorded thereon the above computer program

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
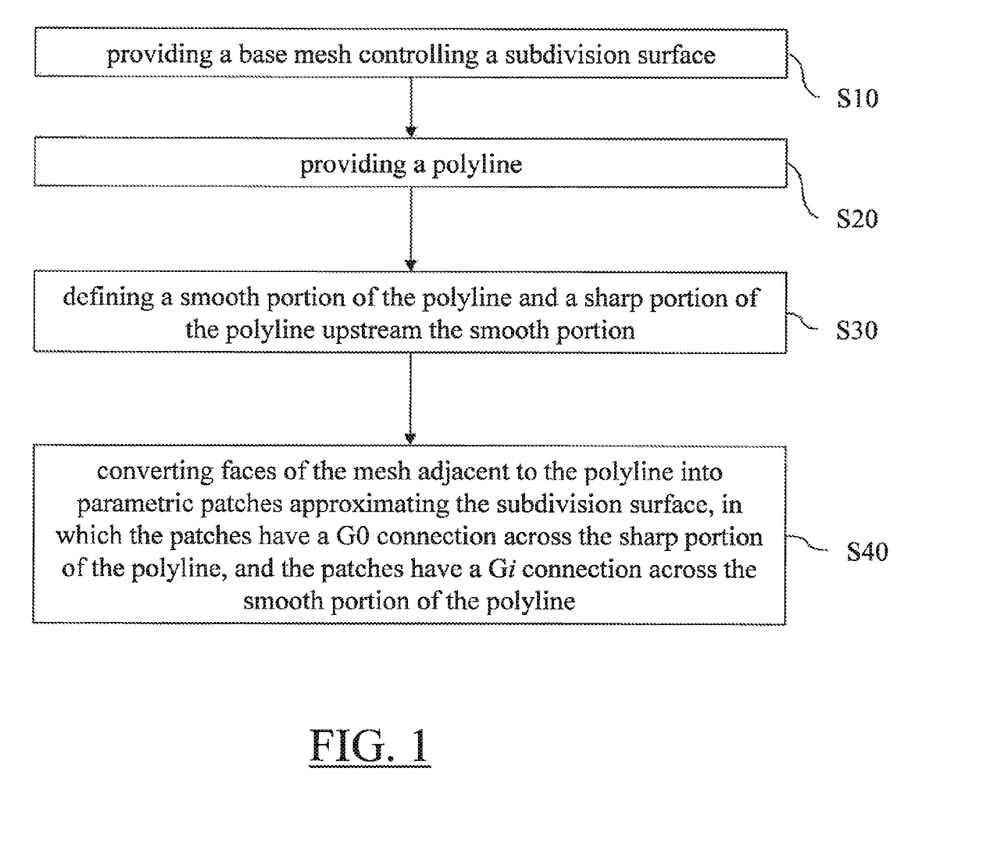
FIG. 1 shows a flowchart of an example of the method.

FIG. 1 shows a flowchart of an example of a computer-implemented method for designing a 3D modeled object. The method comprises the step of providing S10 a base mesh controlling a subdivision surface. The subdivision surface models the 3D modeled object. The method also comprises the step of providing S20 a polyline. A polyline consists of connected edges of the base mesh. The method also comprises the step of defining S30 a smooth portion of the polyline and a sharp portion of the polyline. The smooth portion comprises an extremity of the polyline. The sharp portion is upstream the smooth portion. The method then comprises the step of converting S40 faces of the mesh, which are adjacent to the polyline, into parametric patches. The patches approximate the subdivision surface. The patches have a G0 connection across the sharp portion of the polyline. The patches have a Gi connection across the smooth portion of the polyline, where i is an integer higher or equal to 1 (e.g. i=2). The method of FIG. 1 allows the creation of a character line on the surface modeling the 3D modeled object in a fast, flexible, robust and persistent manner.

A modeled object is any object defined by data stored in a memory of a computer system. By extension, the expression "modeled object" designates the data itself "Designing a 3D modeled object" designates any action or series of actions which is at least part of a process of elaborating a 3D modeled object. Thus, the method may comprise creating the 3D modeled object from scratch. Alternatively, the method may comprise providing a 3D modeled object previously created, and then modifying the 3D modeled object.

The 3D modeled object may be a CAD modeled object or a part of a CAD modeled object. In any case, the 3D modeled object designed by the method may represent the CAD modeled object or at least part of it, e.g. a 3D space occupied by the CAD modeled object. Because the method improves the design of a character line on a surface, the method also improves the design of a CAD modeled object. A CAD modeled object is any object defined by data stored in a memory of a CAD system. According to the type of the system, the modeled objects may be defined by different kinds of data. A CAD system is any system suitable at least for designing a modeled object on the basis of a graphical representation of the modeled object, such as CATIA. Thus, the data defining a CAD modeled object comprise data allowing the representation of the modeled object (e.g. geometric data, for example including relative positions in space).

The method may be included in a manufacturing process, which may comprise, after performing the method, producing a physical product corresponding to the modeled object. In any case, the modeled object designed by the method may represent a manufacturing object. The modeled object may thus be a modeled solid (i.e. a modeled object that represents a solid). The manufacturing object may be a product, such as a part, or an assembly of parts. Because the method improves the design of the modeled object, the method also improves the manufacturing of a product and thus increases productivity of the manufacturing process. The method can be implemented using a CAM system, such as DELMIA. A CAM system is any system suitable at least for defining, simulating and controlling manufacturing processes and operations.

The method is computer-implemented. This means that the method is executed on at least one computer, or any system alike. For example, the method may be implemented on a CAD system. Thus, steps of the method are performed by the computer, possibly fully automatically, or, semi-automatically (e.g. steps which are triggered by the user and/or steps which involve user-interaction). Notably, the providing S10 may be triggered by the user. The providing S20 and/or the defining S30 may be performed through user-interaction and/or triggered by the user. The converting S40 may be fully automatic, or may be semi-automatic (i.e. involve some amount of user-interaction).

A typical example of computer-implementation of the method is to perform the method with a system suitable for this purpose. The system may comprise a memory having recorded thereon instructions for performing the method. In other words, software is already ready on the memory for immediate use. The system is thus suitable for performing the method without installing any other software. Such a system may also comprise at least one processor coupled with the memory for executing the instructions. In other words, the system comprises instructions coded on a memory coupled to the processor, the instructions providing means for performing the method. Such a system is an efficient tool for designing a 3D modeled object.

Such a system may be a CAD system. The system may also be a CAE and/or CAM system, and the CAD modeled object may also be a CAE modeled object and/or a CAM modeled object. Indeed, CAD, CAE and CAM systems are not exclusive one of the other, as a modeled object may be defined by data corresponding to any combination of these systems.

The system may comprise at least one GUI for launching execution of the instructions, for example by the user. Notably, the GUI may allow the user to trigger the step of providing S10. This may be done prior to the providing S20. Or, the base mesh and the polyline may be retrieved simultaneously from a memory and thus provided (S10 and S20) simultaneously. Such a system is an efficient tool for designing a 3D modeled object by a user.

The 3D modeled object is 3D (i.e. three-dimensional). This means that the modeled object is defined by data allowing its 3D representation. A 3D representation allows the viewing of the representation from all angles. For example, the modeled object, when 3D represented, may be handled and turned around any of its axes, or around any axis in the screen on which the representation is displayed. This notably excludes 2D icons, which are not 3D modeled, even when they represent something in a 2D perspective. The display of a 3D representation facilitates design (i.e. increases the speed at which designers statistically accomplish their task). This speeds up the manufacturing process in the industry, as the design of the products is part of the manufacturing process.

Figure 2:
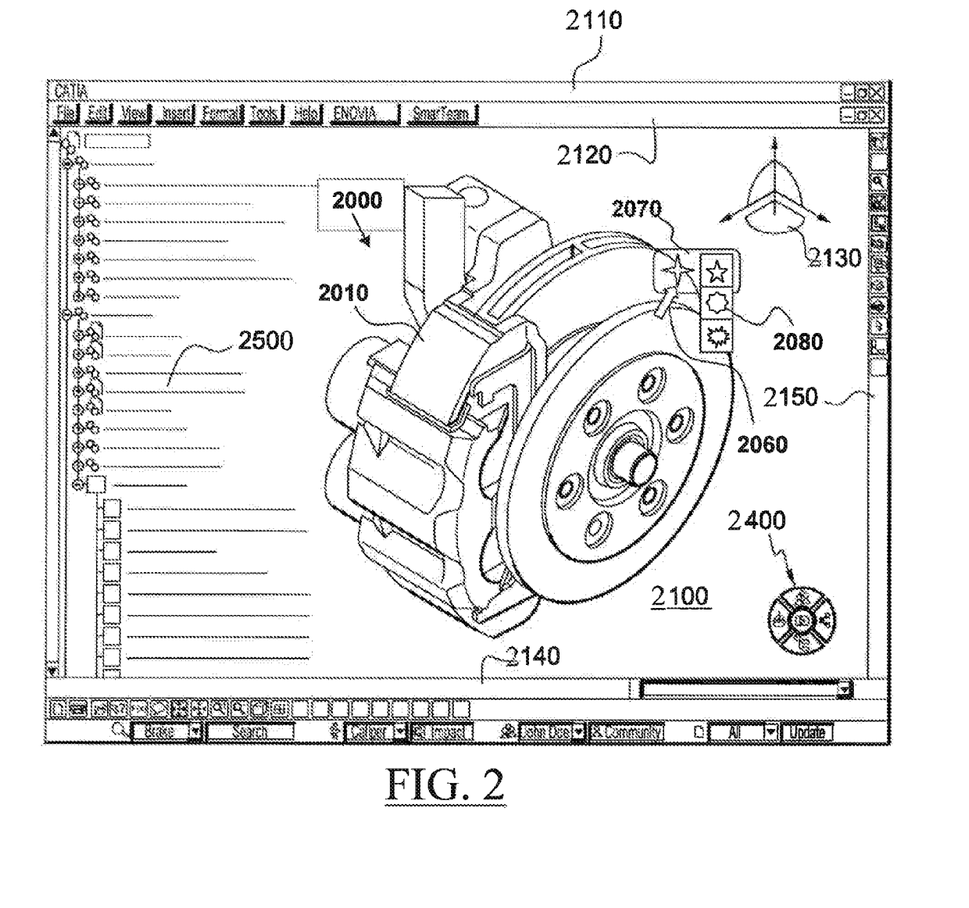
FIG. 2 shows an example of a graphical user interface.

FIG. 2 shows an example of the GUI of a typical CAD system.

The GUI 2100 may be a typical CAD-like interface, having standard menu bars 2110, 2120, as well as bottom and side toolbars 2140, 2150. Such menu and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. a sculpting operation, or any other operation such change the dimension, color, etc.) or edit geometrical constraints by selecting an appropriate icon. For example, typical CAD operations are the modeling of the punching or the folding of the 3D modeled object displayed on the screen.

The GUI may for example display data 2500 related to the displayed product 2000. In the example of FIG. 2, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 3:
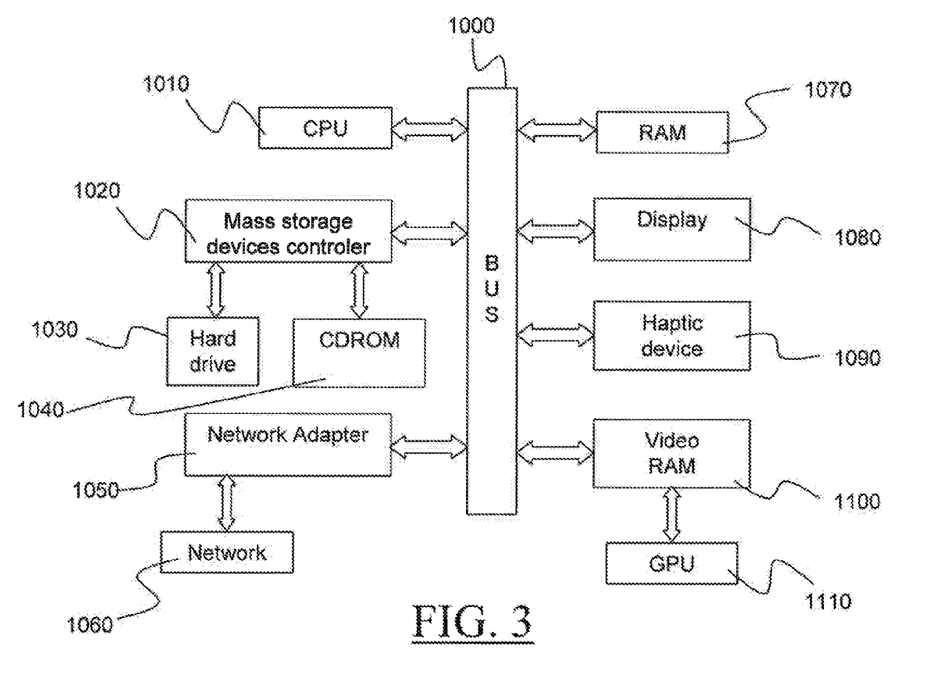
FIG. 3 shows an example of a client computer system.

FIG. 3 shows an example of the architecture of the system as a client computer system, e.g. a workstation of a user.

The client computer comprises a central processing unit (CPU) 1010 connected to an internal communication BUS 1000, a random access memory (RAM) 1070 also connected to the BUS. The client computer is further provided with a graphics processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on screen 1080, as mentioned with reference to FIG. 2. By screen, it is meant any support on which displaying may be performed, such as a computer monitor. In addition, the cursor control device allows the user to select various commands, and input control signals. The cursor control device includes a number of signal generation devices for input control signals to system. Typically, a cursor control device may be a mouse, the button of the mouse being used to generate the signals.

To cause the system to perform the method, it is provided a computer program comprising instructions for execution by a computer, the instructions comprising means for this purpose. The program may for example be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output. The instructions may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be a compiled or interpreted language. The program may be a full installation program, or an update program. In the latter case, the program updates an existing CAD system to a state wherein the system is suitable for performing the method.

Providing S10 a base mesh controlling a subdivision surface may comprise retrieving said base mesh from a memory of the system, or loading said mesh from an external memory, or even designing (by the user) said base mesh from scratch or from a retrieved intermediate version.

The base mesh is a mesh. As widely known from the field of CAD, a mesh comprises a set of vertices (points having a 3D position) and edges linking vertices two-by-two and forming so-called faces of the mesh (i.e. smallest cycles of edges). The mesh may be any type of mesh, for example triangular (in which case faces of the mesh consist, at least in majority, of three edges) or a quad mesh (in which case faces of the mesh consist, at least in majority, of four edges).

The "base" mesh is the underlying mesh in the data defining the geometry of the 3D modeled object. In other words, the geometry of the object is represented by the mesh. More specifically and in a known way, the base mesh is conceptually associated to a subdivision algorithm. Subdividing infinitely the base mesh according to said subdivision algorithm would result in a surface, called "subdivision surface", that represents the envelope of the designed 3D modeled object and thereby models the 3D modeled object. It is thus said that the base mesh "controls" the subdivision surface. The subdivision algorithm may be any known subdivision algorithm, such as the Catmull-Clark subdivision algorithm in the case of a quad mesh, or the Loop subdivision algorithm in the case of a triangular mesh.

Now, as mentioned earlier and as widely known, for the purpose of practicability, the subdivision surface is actually not determined by the system. Instead, the system determines an approximation thereof under the form of a set of parametric patches, typically NURBS or Bézier surface patches. For example, the system stores a program for performing a scheme that converts the mesh into a set of parametric patches that approximates the subdivision surface. In this sense, the scheme corresponds to the underlying subdivision algorithm. Said scheme may be called "mesh-to-surface conversion scheme" in the following.

As widely known from the field of CAD using base meshes controlling subdivision surfaces, a "polyline" designates any chain of lines of edges (a "line" being itself a topologically straight chain of at least one edge). In other words, a polyline consists of connected edges of the base mesh. Now, providing S20 the polyline may comprise retrieving said polyline from a memory of the system, or loading said polyline from an external memory, or, preferably, manually defining (by the user) said polyline on the base mesh. In any case, data that designate this polyline are present among the data defining the 3D modeled object. The method allows modeling a character line on the final surface (i.e. a sharp fold that runs on the surface) notably by defining such a polyline on the base mesh. As the method may update existing models (for which character lines were defined using a previous method), the polyline is not necessarily defined by the user, but may as well be retrieved, e.g. as a polyline of edges to which a G0 connection attribute has previously been associated. In any case, the edges of the polyline may have a G0 connection attribute. Notably, the providing S20 may comprise the user defining a G0 connection attribute on a chain of edges and thereby defining the polyline.

As known in the art, other data than the mesh may model the 3D modeled object. Such data may be used as input conditions by the mesh-to-surface conversion scheme. Such data may for example comprise attributes associated to elements of the base mesh. Said attributes may define a condition to be respected by the conversion process. Notably, a G0 connection attribute may be associated to the edges of the polyline. A G0 connection attribute for an edge is, by definition, data associated to said edge that represent intent of the user that the final surface (the surface resulting from the conversion process) has a G0 continuity across a curve of the surface corresponding to the polyline. As known per se, the mesh-to-surface conversion scheme of the system is adapted to use such data and convert the faces of the mesh adjacent to said edge (with a G0 connection attribute) into adjacent parametric patches which connect with a G0 continuity. It is said that the mesh-to-surface conversion scheme "applies a G0 connection attribute" to the edge when converting its adjacent faces into parametric patches. Similarly, an edge may have a Gi connection attribute, in which case the mesh-to-surface conversion scheme "applies a Gi connection attribute" to the edge when converting its adjacent faces into parametric patches, which results in the patches corresponding to said faces connecting to each other with a Gi continuity across a curve corresponding to the edge.

When a user wants to design a character line on a surface using subdivision surface technology of the prior art, that is to say, using a base mesh converted into parametric surfaces, it is possible to define said character line by associating a polyline of the base mesh with a G0 connection attribute (and other edges with a Gi connection attribute, e.g. by default, where i>0). In such case, the mesh-to-surface conversion scheme of the prior art takes said attribute into account and the resulting surface presents a sharp curve (the character line) corresponding to the polyline.

Instead or in addition to this prior art technique, the method also comprises the step of defining S30 (by the user) a smooth portion of the polyline and a sharp portion of the polyline. Data defining said portions is thus added to the data defining the modeled object. The edges of the polyline may or may not have the G0 continuity attribute. What matters is that the method then comprises the step of converting S40 faces of the mesh, which are adjacent to the polyline (i.e. faces for which at least one edge or vertex is part of the polyline), into parametric patches (e.g. NURBS patches) in a classic way (notably, the patches approximate the subdivision surface), but such that the patches have a G0 connection across the sharp portion of the polyline and the patches have a Gi connection across the smooth portion of the polyline, with i being an integer superior or equal to 1 (i.e. or i>0). In other words, the mesh-to-surface conversion scheme ensures a G0 continuity (i.e. sharpness) of the final surface (i.e. comprising the parametric patches) over a curve corresponding to the sharp portion of the polyline, and a Gi continuity (smoothness) of the final surface over a curve corresponding to the smooth portion of the polyline.

The method of FIG. 1 thus allows the creation of a character line on the surface modeling the 3D modeled object in a fast, flexible and robust manner. Indeed, the smooth portion and the sharp portion are any portion of the polyline. Notably, the smooth portion and/or the sharp portion may be delimited by a point which is not a vertex of the mesh. Thus, the method allows the creation of a character line in an easy way, at any level of detail, without having to subdivide the base mesh or modify its vertices (for example for imposing an arbitrary length to the character line). Regardless, the polyline and the smooth and sharp portions may be stored among the data defining the model. Thus, even if the mesh is later modified, the character line may be obtained through the mesh-to-surface conversion, regardless of the history of the modifications (unlike in the case of the prior art where the character line is defined by modifying control points of the NURBS approximation).

The smooth portion and the sharp portion are parts of the polyline which are respectively associated to relevant data for the method to perform the conversion with G0 connection across the sharp portion and a Gi connection across the smooth portion. The smooth portion comprises an extremity of the polyline. The sharp portion is upstream the smooth portion. There may or may not be a third portion, e.g. called "transition portion", between the smooth and sharp portions, corresponding to the above-mentioned transition zone of the character line. Indeed, the polyline is open, having two extremities. The direction referred to is defined towards the considered extremity. At any location on the polyline and given one extremity, "downstream" means toward the extremity, and "upstream" means toward the other direction. Thus, the character line resulting from the method fades smoothly on the surface, and the transition is controlled by the user, by defining the smooth portion and the sharp portion as any portion of the polyline at will.

The invention provides a way for the designer to control the shape of the transition zone through the transition portion. The transition zone belongs to the resulting surface. One end of the transition zone is connected to the extremity of the character line. At the other end of the transition zone the surface is smooth. The key point is that the transition zone specification is captured at the base mesh level, which is the input object of the whole process. This makes the process associative, meaning that the user can, a posteriori, modify the transition zone, modify the base mesh (or even both at the same time) and that the system is able to update the new shape.

In an example, the smooth portion is defined on an extremity line of the polyline. Notably, the smooth portion may be an extremity portion of an extremity edge of the polyline. This allows a refinement of the character line, compared to merely modeling it by associating a G0 connection attribute to edges of a polyline. In other words, this allows avoiding an excessive refinement of the base mesh, and thus memory and CPU resource saving. Indeed, the less refined the base mesh, the better the system may handle the modeled object from a resource point of view.

Now, the method may comprise defining two smooth portions, on the two extremities of the polyline. The sharp portion may be defined between the two smooth portions (upstream each smooth portion, from the point of view of the extremity associated to each smooth portion). Indeed, the character line may vanish smoothly on its two extremities. For the purpose of clarity, it is referred in the following to only one smooth portion, being understood that the explanations related to one smooth portion may be applied to the other smooth portion should it be the case.

Clearly, the method avoids manual and repetitive tasks consisting in local re-patching transition zones after a base mesh change. This way, the user can spend extra time for exploring alternate design solutions or can release the design earlier than the prior art solution. Furthermore, the quality of the resulting surface is enhanced for three reasons. First, the method does not modify the subdivision surface itself but its (NURBS) approximation. This way it is not constrained by the subdivision rules and by barycentric effects that usually lead to geometric sliding. Second, no other patches than those directly involved in the transition zone are modified: the change is local. There is no propagation to any neighborhood. Third, the method provides an automated process. Thus, repetitive tasks that may lead to mistakes are avoided.

An example of the method is now discussed with reference to FIGS. 4-21.

Figure 4:
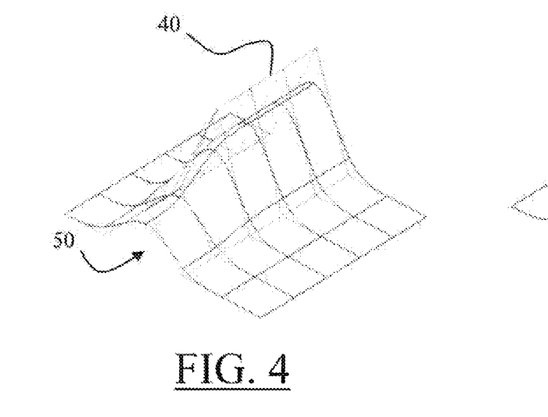
FIGS. 4-21 show examples of the method.
Figure 5:
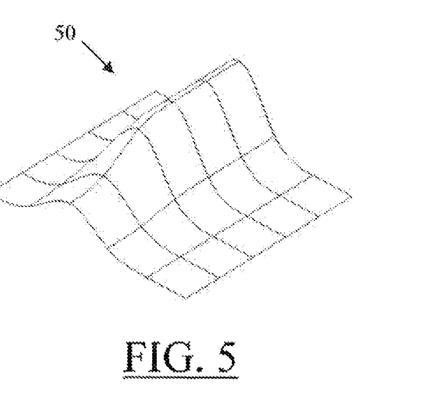

As shown on FIGS. 4 and 5, the method of the example comprises the providing S10, the provided data being base mesh 40 that controls subdivision surface approximated by the set of parametric patches 50. FIG. 4 illustrates the approximation of subdivision surface 50 together with its base mesh 40. FIG. 5 illustrates the approximation of subdivision surface 50 alone.

Figures 6, 7:
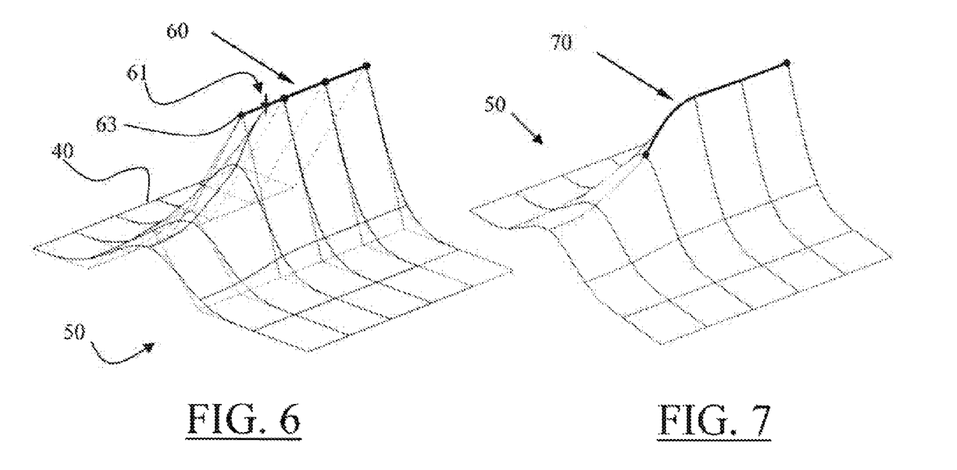
Figure 8:
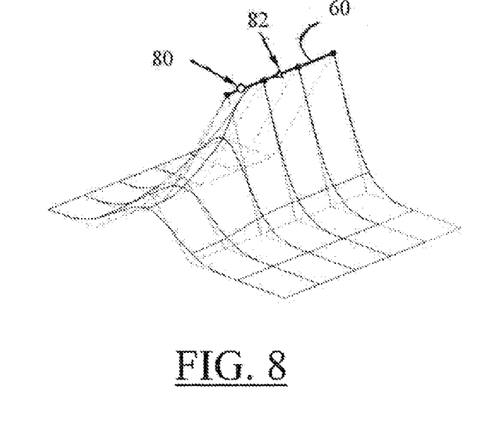
Figure 9:
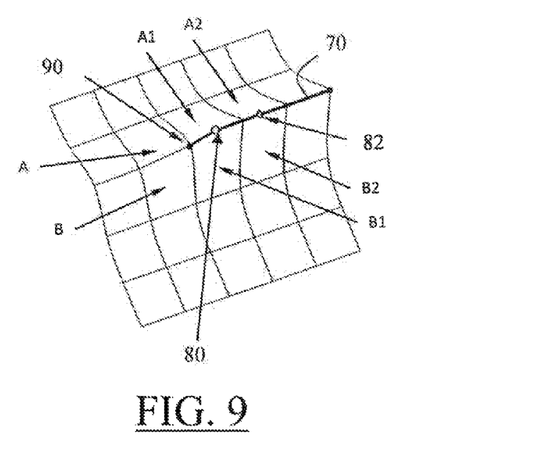

As shown on FIGS. 6 and 7, the user may design a character line 70 by defining (i.e. the providing S20) a sequence of consecutive line segments on base mesh 40. This selected polyline 60 is open, otherwise there would be no transition zone. In the prior art, the surface 50 resulting from the mesh-to-surface conversion includes the character line 70 as a sharp curve corresponding to polyline 60. FIG. 6 illustrates the surface 50 together with base mesh 40. Bold line is the polyline 60 where the user sets a G0 connection attribute. FIG. 7 shows surface 50 alone according to the prior art, featuring character line 70 (bold line). This capacity is a standard feature of subdivision surface technology, see for example the paper by Tony DeRose, Michael Kass, Tien Truong, *Subdivision Surfaces in Character Animation*. SIGGRAPH 1998.

Referring to FIG. 6, at location 61 and given extremity 63, "downstream" means toward extremity 63, i.e. the left part of polyline (left to location 61 on the figure), and "upstream" means toward the other direction, i.e. the right part of the polyline (right to location 61 on the figure).

In addition to the prior art, the method of the example comprises the definition of a smooth portion and a sharp portion. The following describes the management of one extremity of the polyline referring to FIG. 8. When needed, the other extremity is managed exactly the same way.

In the example, defining the smooth portion comprises defining a smooth point on the polyline, the smooth portion being delimited by the smooth point and the extremity of the polyline. The defining step (S30) may further comprise defining a sharp point on the polyline upstream the smooth point, the sharp portion being then delimited by the sharp point and being upstream the sharp point. Thus, the smooth portion is between the extremity and the smooth point, and the sharp portion is from the sharp point and not comprising the smooth point. Close to the end of polyline 60 (e.g. on the two extremity edges in the example), the user creates two points that will control the transition zone: the so-called "sharp point" 82 (triangle symbol on FIG. 8) and the so called "smooth point" 80 (circle symbol on FIG. 8). The position of each point is attached to the base mesh through its linear abscissa on polyline 60.

The converting step (S40) of the method of the example comprises converting (S42) faces adjacent to edges of the polyline intersecting the smooth portion (i.e. all faces that include an edge or a vertex which is part of the polyline and which is whether included in the smooth portion, or, which includes the smooth point if it is an edge) into first patches, in which said conversion (S42) applies a Gi connection attribute to said edges. Thus, the converting (S42) results in a Gi continuity across a curve on the surface corresponding to the assembly of first patches, the curve corresponding to the edges of the polyline intersecting the smooth portion.

The converting step (S40) of the method of the example also comprises converting (S44) faces adjacent to edges of the polyline intersecting the sharp portion (i.e. all faces that include an edge or a vertex which is part of the polyline and which is whether included in the sharp portion, or, which includes the sharp point if it is an edge) into second patches, in which said conversion (S44) applies a G0 connection attribute to said edges (just as done for all faces adjacent to the polyline of the surface of FIG. 7). Thus, the converting (S44) results in a sharp curve (i.e. a curve on a surface across which the continuity is G0) on the assembly of the second patches (i.e. the surface consisting of the set of second patches), said sharp curve corresponding to said edges (it is said by definition that the sharp curve "corresponds" to the edges of the polyline that intersect the sharp portion).

Indeed, the method shapes the NURBS patches (approximating the theoretic subdivision surface) in the neighborhood of sharp point 82 and smooth point 80. The arrangement of initial patches adjacent to the character line (corresponding to faces of the base mesh adjacent to the polyline) is illustrated on FIG. 9, which reproduces the prior art surface of FIG. 7. Sharp point 82 and smooth point 80 positions on the character line 70 are illustrated as well. The patches to be reshaped (compared to the prior art solution of FIG. 7 or 9) are those that meet the end vertex 90 of the character line (patches A and B on FIG. 9) and those that meet the character line segment from its end vertex to the sharp point 82 (patches A1, A2, B1 and B2 on FIG. 9).

The shape of patches A, A1, B and B1 is influenced by the sharpness (i.e. the G0 continuity attribute) of the neighboring character line. In particular, this induces a curvature jump which is not compatible with the expected smoothness of the targeted resulting surface. This phenomenon is observed from industrial test cases. For this reason, prior art patches A, A1, B and B1 are replaced in the method of the example by new patches A', A1', B' and B1' defined as follows. First, the method considers the base mesh of the input surface. Second, the method removes the sharp edge specification (i.e. the G0 continuity attribute, if any) from this base mesh. Third, the method computes the resulting surface (i.e. applying the regular Gi attribute). Finally, the method extracts patches A', A1', B' and B1' corresponding to patches A, A1, B and B1. It is noted that for faces not adjacent to any polyline of the method, the mesh-to-surface conversion occurs as in the prior art (e.g. by applying a Gi attribute to edges).

Figure 10:
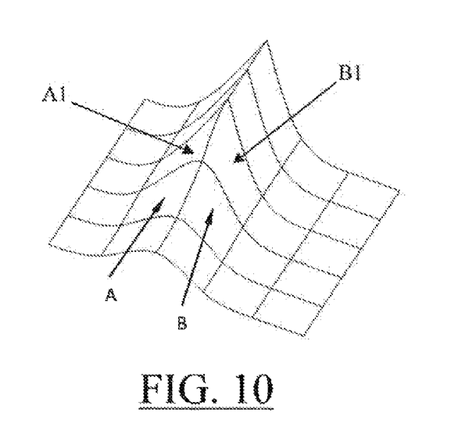
Figure 11:
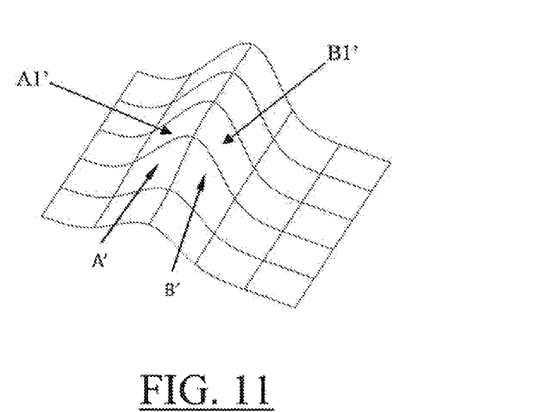
Figure 12:
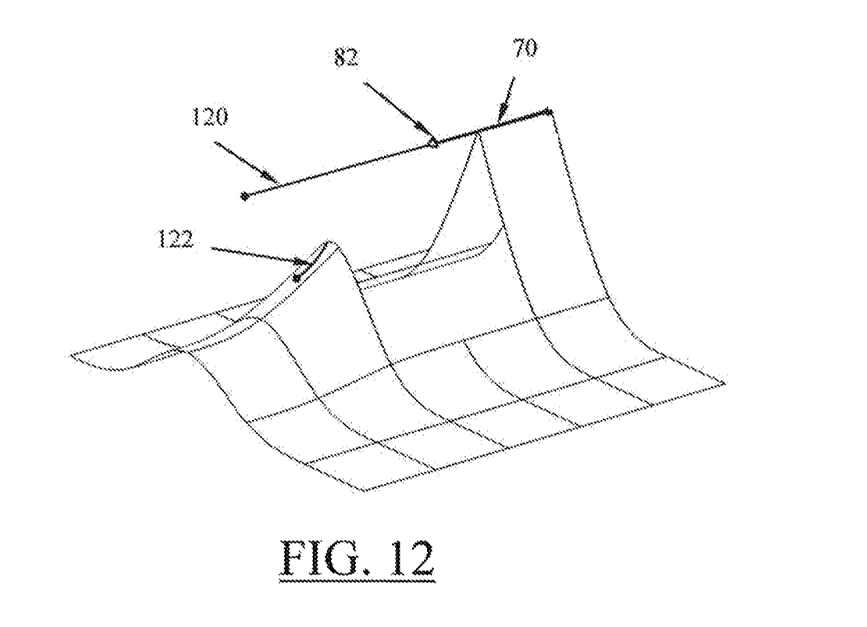

The correspondence of the last step is possible because the input surface and the surface resulting from the third step have the same patches arrangement. This is because the topology of their respective base meshes is the same. FIG. 10 (prior art) illustrates patches A, A1, B and B1 on the surface featuring the sharp edge. FIG. 11 illustrates patches A', A1', B' and B1' on the surface with no sharp edge computed from on the same base mesh (surface from third step above). Base meshes are not illustrated. Notice that the method leads to a smoother transition zone.

The converting step (S40) of the method of the example then comprises trimming the second patches downstream the sharp point. The converting step (S40) of the method of the example further comprises trimming the first patches upstream a point corresponding to the smooth point. These two actions each make sure that no part of the patches corresponds to the transition zone of the character line. Then, the final surface can be reached by filling the hole corresponding to the transition zone.

In the example, as will be discussed the method further comprises extrapolating (i.e. extending) the sharp curve (e.g. according to any extrapolation method known per se), projecting the extrapolation of the sharp curve on the first patches, determining a connection curve, wherein the connection curve is a curve obtained by blending the projection of the extrapolation of the sharp curve (on the first patches) with the sharp curve (e.g. according to any blending method known per se). Then, the method may simply fill the two holes formed between the first patches, the second patches, the connection curve, and patches corresponding to faces of the mesh not adjacent to the polyline. Such a method is an efficient and flexible means for designing the transition zone of the character line on the final surface.

The surface made of patches A1' and B1' is named surface C in the following. Next step is to replace (compared to the prior art) remaining patches (A2 and B2) by a filling surface the size of which is controlled through the sharp and smooth points. For this purpose, a so called "connection curve" is created as follows, referring to FIG. 12. The sharp curve 70 is extrapolated from sharp point 82 in such a way that it can be projected on surface C, so as to provide projection 122. The length of this extrapolation 120 is controlled by the position of the smooth point, according to any way.

Figure 13:
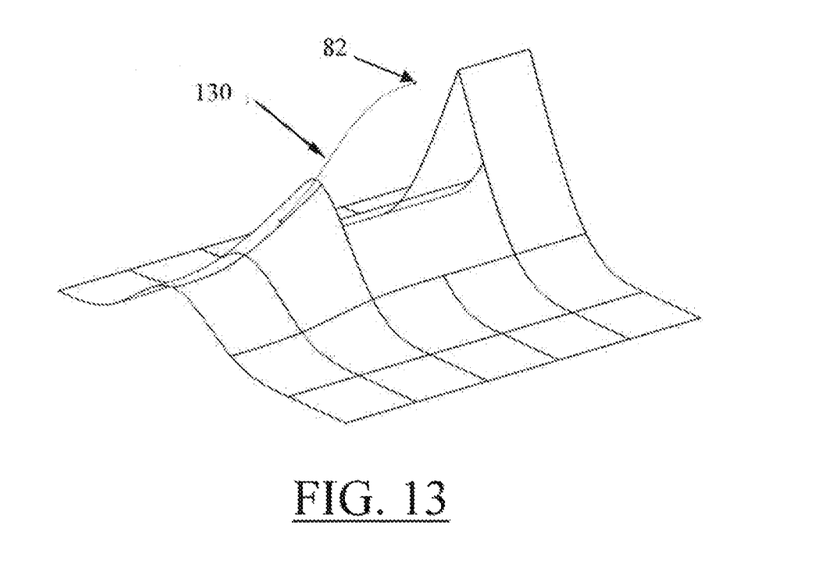

Then, referring to FIG. 13, the connection curve 130 joins sharp point 82 of the sharp curve to the end point of the projection 122 of the extrapolated curve projected on surface C.

Figure 14:
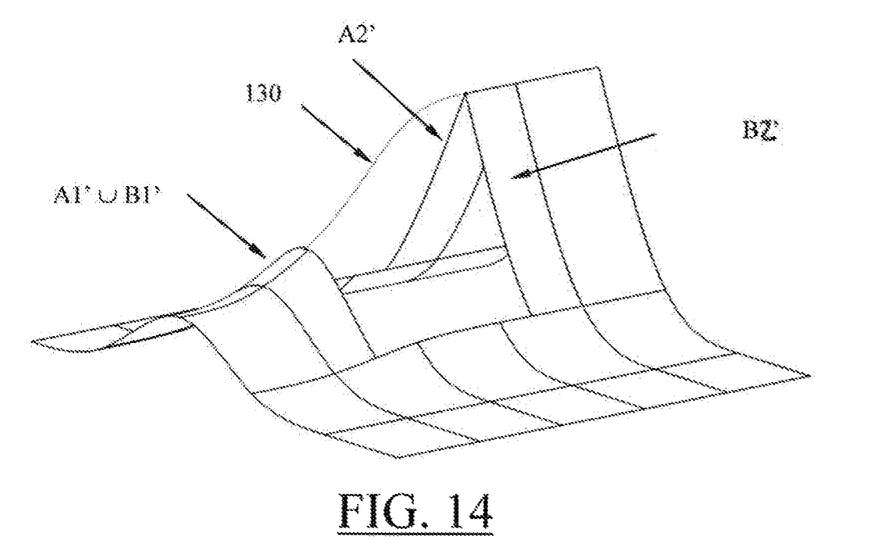

Next step is to trim surface C, so as to reach A1'∪B1' on FIG. 14 (the trimmed patches are not renamed for the purpose of simplicity), and initial patches B2 and A2, so as to reach A2' and B2' (the trimmed patches are not renamed for the purpose of simplicity), according to the end points of the connection curve. FIG. 14 illustrates the resulting opening together with connection curve 130.

Figure 15:
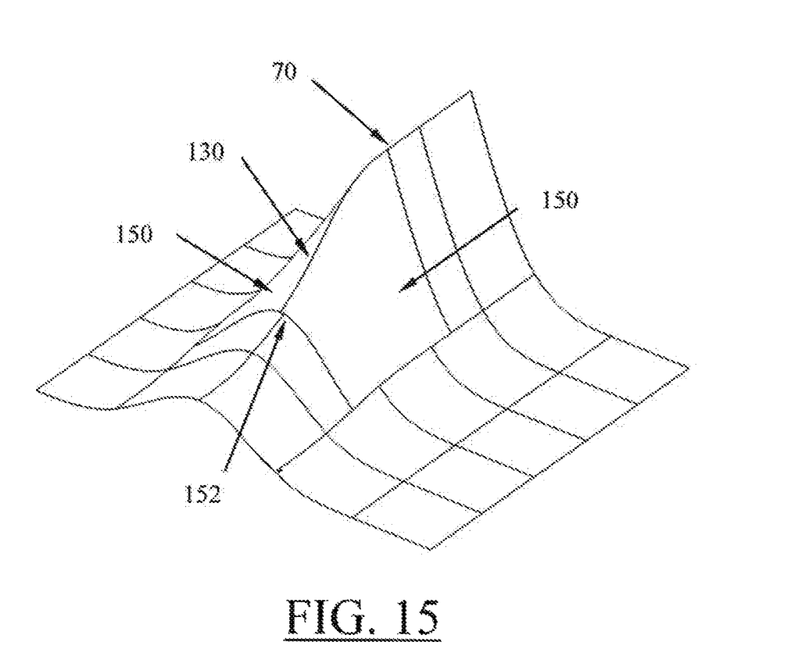
Figure 16:
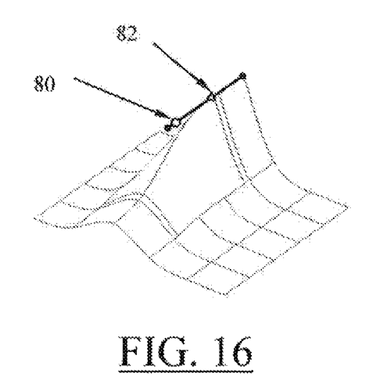
Figure 17:
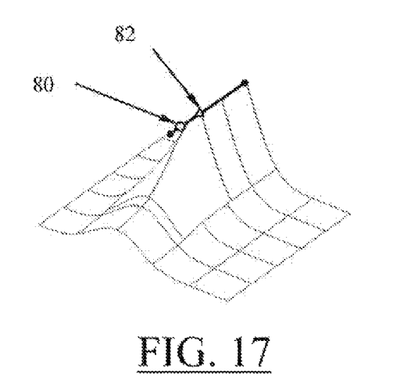
Figure 18:
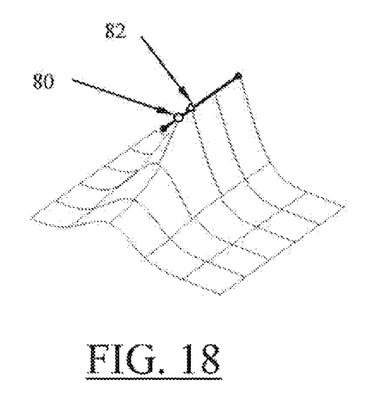
Figure 19:
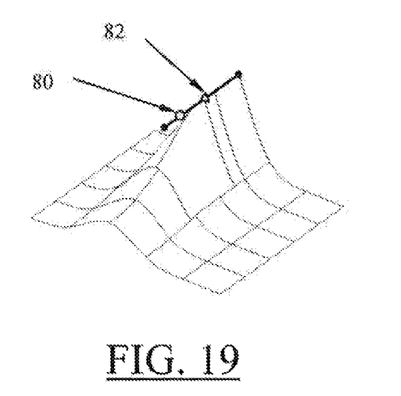
Figure 20:
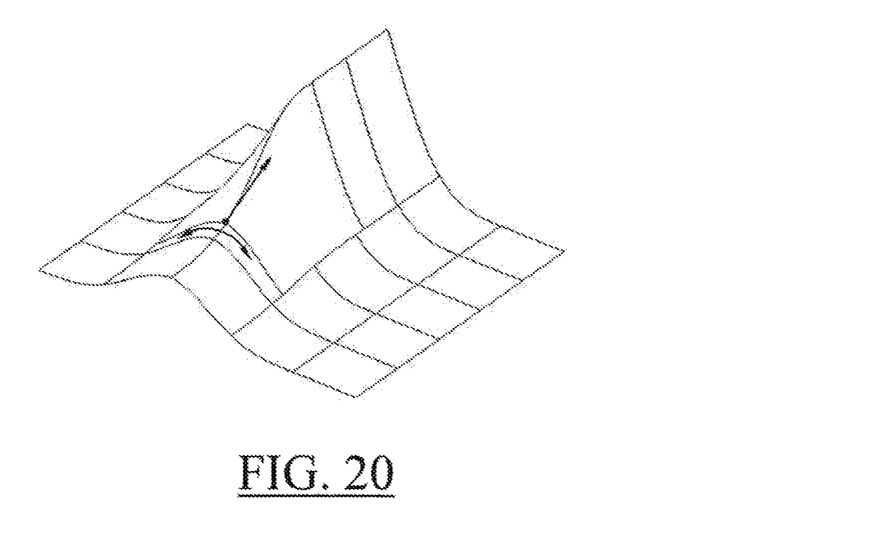

Referring to FIG. 15, the resulting opening is filled with two filling surfaces 150, e.g. according to any filling algorithm know per se. They are tangent to all neighboring patches except along the connection curve, which can be called now fading edge. Clearly, along the fading edge, the resulting surface changes from a sharp shape 70 to a smooth shape.

FIGS. 16-19 illustrate various width of the transition zone after the user changed the positions of sharp points and smooth points on the base mesh. Notice the size of the filling surfaces and the trimmed neighboring patches.

Determining the connection curve may further comprise user-interaction. Indeed, referring to FIG. 20, additional styling design flexibility can be added by controlling the end point of the fading edge: position along surface C boundary curve, tangent vector direction, tension parameter.

Figure 21:
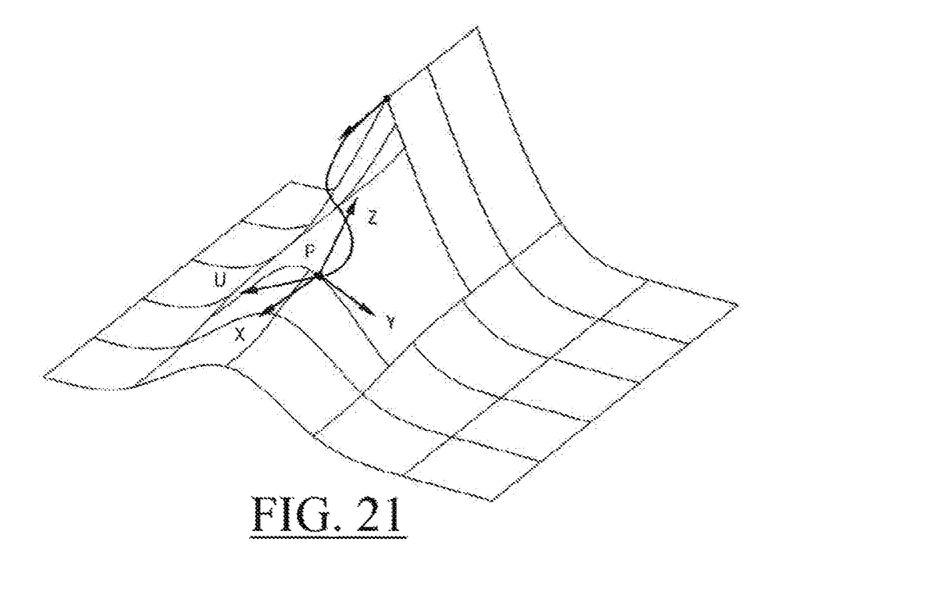

The position of point P on the boundary curve of surface C is defined by its curvilinear abscissa. At point P, the following axis system is defined. Vector Z is the normal vector to surface C, vector Y is perpendicular to the boundary curve of surface C and vector X is the cross product of vector Z and vector Y. In this axis system, the position of the tangent vector U to the connection curve is captured through its angle with vector Y. By nature, vector U is perpendicular to vector Z. FIG. 21 illustrates how the end point of the connection curve is controlled through the local axis system.

The connection curve can be controlled by the user through parameters defined by the user and captured at the level of the base mesh. This way, from one update to another, specifications are saved so that no local repair is necessary.

What is claimed is:

1. A computer-implemented method for designing a three-dimensional (3D) modeled object, wherein the method comprises the steps of:
    providing a base mesh controlling a subdivision surface, the subdivision surface modeling the 3D modeled object;
    providing a polyline consisting of connected edges of the base mesh;
    providing a smooth portion of the polyline, including a smooth point on the polyline, and a sharp portion of the polyline, including a sharp point on the polyline; and
    converting faces of the base mesh adjacent to the polyline into parametric patches approximating the subdivision surface, in which the parametric patches have a G0 connection across the sharp portion of the polyline, and the parametric patches have a Gi connection across the smooth portion of the polyline, where i is an integer higher or equal to 1, wherein the converting further comprises:
        converting faces adjacent to first edges of the polyline intersecting the smooth portion into first patches by applying a Gi connection attribute to the first edges,
        converting faces adjacent to second edges of the polyline intersecting the sharp portion into second patches by applying a G0 connection attribute to the second edges, resulting in a sharp curve on assembly of the second patches, the sharp curve corresponding to the second edges,
        trimming the second patches downstream the sharp point,
        extrapolating the sharp curve,
        projecting the extrapolation of the sharp curve on the first patches,
        determining a connection curve by blending the projection of the extrapolation of the sharp curve with the sharp curve, and
        filling two holes formed between the first patches, the second patches, the connection curve, and patches corresponding to faces of the base mesh not adjacent to the polyline.

2. The method of claim 1, wherein the converting step further comprises trimming the first patches upstream a point corresponding to the smooth point.

3. The method of claim 1, wherein determining the connection curve comprises user-interaction.

4. The method of claim 1, wherein the parametric patches are non-uniform rational B-spline surfaces (NURBS).

5. The method of claim 1, further comprising:
    defining the smooth portion of the polyline comprising an extremity of the polyline, and the sharp portion of the polyline being upstream the smooth portion.

6. The method of claim 5, wherein defining the smooth portion comprises defining the smooth point on the polyline, the smooth portion being delimited by the smooth point and the extremity of the polyline.

7. The method of claim 6, further comprising defining the sharp point on the polyline upstream the smooth point, the sharp portion being delimited by the sharp point and being upstream the sharp point.

8. A computer program product, comprising:
    a non-transitory computer readable storage medium, the computer readable storage medium having instructions for designing a three-dimensional (3D) modeled object by:
        providing a base mesh controlling a subdivision surface, the subdivision surface modeling the 3D modeled object;
        providing a polyline consisting of connected edges of the base mesh;
        providing a smooth portion of the polyline, including a smooth point on the polyline, and a sharp portion of the polyline, including a sharp point on the polyline; and
        converting faces of the base mesh adjacent to the polyline into parametric patches approximating the subdivision surface, in which the parametric patches have a G0 connection across the sharp portion of the polyline, and the parametric patches have a Gi connection across the smooth portion of the polyline, where i is an integer higher or equal to 1, wherein the converting further comprises:
            converting faces adjacent to first edges of the polyline intersecting the smooth portion into first patches by applying a Gi connection attribute to the first edges,
            converting faces adjacent to second edges of the polyline intersecting the sharp portion into second patches by applying a G0 connection attribute to the second edges, resulting in a sharp curve on assembly of the second patches, the sharp curve corresponding to the second edges,
            trimming the second patches downstream the sharp point,
            extrapolating the sharp curve,
            projecting the extrapolation of the sharp curve on the first patches,
            determining a connection curve by blending the projection of the extrapolation of the sharp curve with the sharp curve, and
            filling two holes formed between the first patches, the second patches, the connection curve, and patches corresponding to faces of the base mesh not adjacent to the polyline.

9. The computer program product of claim 8, further having instructions for:
    defining the smooth portion of the polyline comprising an extremity of the polyline, and the sharp portion of the polyline being upstream the smooth portion.

10. The computer program product of claim 9, wherein defining the smooth portion comprises defining the smooth point on the polyline, the smooth portion being delimited by the smooth point and the extremity of the polyline.

11. The computer program product of claim 10, further comprising defining the sharp point on the polyline upstream the smooth point, the sharp portion being delimited by the sharp point and being upstream the sharp point.

12. A Computer-Aided Design (CAD) system comprising a processor coupled to a memory and a graphical user interface, the memory having recorded thereon a computer program for performing a computer-implemented method for designing a three-dimensional (3D) modeled object, wherein the method comprises the steps of:
    providing a base mesh controlling a subdivision surface, the subdivision surface modeling the 3D modeled object;
    providing a polyline consisting of connected edges of the base mesh;
    providing a smooth portion of the polyline, including a smooth point on the polyline, and a sharp portion of the polyline, including a sharp point on the polyline; and
    converting faces of the base mesh adjacent to the polyline into parametric patches approximating the subdivision surface, in which the parametric patches have a G0 connection across the sharp portion of the polyline, and the parametric patches have a Gi connection across the smooth portion of the polyline, where i is an integer higher or equal to 1, wherein the converting further comprises:

converting faces adjacent to first edges of the polyline intersecting the smooth portion into first patches by applying a Gi connection attribute to the first edges, converting faces adjacent to second edges of the polyline intersecting the sharp portion into second patches by applying a G0 connection attribute to the second edges, resulting in a sharp curve on assembly of the second patches, the sharp curve corresponding to the second edges, trimming the second patches downstream the sharp point, extrapolating the sharp curve, projecting the extrapolation of the sharp curve on the first patches, determining a connection curve by blending the projection of the extrapolation of the sharp curve with the sharp curve, and filling two holes formed between the first patches, the second patches, the connection curve, and patches corresponding to faces of the base mesh not adjacent to the polyline.

13. The CAD system of claim 12, wherein the performed method further comprising:

defining the smooth portion of the polyline comprising an extremity of the polyline, and the sharp portion of the polyline being upstream the smooth portion.

14. The CAD system of claim 13, wherein defining the smooth portion comprises defining the smooth point on the polyline, the smooth portion being delimited by the smooth point and the extremity of the polyline.

15. The CAD system of claim 14, further comprising defining the sharp point on the polyline upstream the smooth point, the sharp portion being delimited by the sharp point and being upstream the sharp point.

* * * * *